United States Patent
Bhagavat et al.

(10) Patent No.: US 12,424,471 B2
(45) Date of Patent: *Sep. 23, 2025

(54) WAFER BOATS FOR SUPPORTING SEMICONDUCTOR WAFERS IN A FURNACE

(71) Applicant: GlobalWafers Co., Ltd., Hsinchu (TW)

(72) Inventors: Sumeet S. Bhagavat, St. Charles, MO (US); Qingmin Liu, Glen Carbon, IL (US)

(73) Assignee: Globalwafers Co., Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/667,033

(22) Filed: May 17, 2024

(65) Prior Publication Data

US 2024/0304482 A1    Sep. 12, 2024

Related U.S. Application Data

(63) Continuation of application No. 17/355,538, filed on Jun. 23, 2021, now Pat. No. 12,046,495.

(60) Provisional application No. 63/044,700, filed on Jun. 26, 2020.

(51) Int. Cl.
H01L 21/673    (2006.01)
B65D 85/48    (2006.01)

(52) U.S. Cl.
CPC ............................. H01L 21/6732 (2013.01)

(58) Field of Classification Search
CPC ......... H01L 21/67303; H01L 21/67309; H01L 21/6732; B65D 85/30; B65D 85/48
USPC ............. 206/454, 710–711, 832; 211/41.18; 414/729
See application file for complete search history.

(56) References Cited

U.S. PATENT DOCUMENTS

| | | | |
|---|---|---|---|
| 5,534,074 A | 7/1996 | Koons | |
| 5,556,275 A * | 9/1996 | Sakata | C23C 16/54 432/5 |
| 5,779,797 A * | 7/1998 | Kitano | H01L 21/67115 118/724 |
| 5,931,662 A * | 8/1999 | Adachi | H01L 21/67303 257/E21.321 |
| 6,062,853 A | 5/2000 | Shimazu et al. | |
| 6,099,302 A * | 8/2000 | Hong | C30B 31/14 211/41.18 |
| 6,171,400 B1 * | 1/2001 | Wingo | H01L 21/67309 211/41.18 |
| 6,727,191 B2 * | 4/2004 | Zehavi | H01L 21/324 118/724 |
| 6,776,289 B1 | 8/2004 | Nyseth | |
| 6,939,132 B2 | 9/2005 | Loo | |
| 7,033,168 B1 | 4/2006 | Gupta et al. | |

(Continued)

FOREIGN PATENT DOCUMENTS

| | | |
|---|---|---|
| CN | 1600905 A | 3/2005 |
| CN | 101173368 A | 5/2008 |

(Continued)

*Primary Examiner* — Luan K Bui
(74) *Attorney, Agent, or Firm* — Armstrong Teasdale LLP

(57) ABSTRACT

A wafer boat for supporting a plurality of semiconductor wafers in a furnace is disclosed. The wafer boat includes a set of fingers each having a contact protuberance which contacts and supports a semiconducting wafer. The contact protuberances may be arranged in a rotationally symmetric pattern about the wafer boat.

19 Claims, 7 Drawing Sheets

(56) References Cited

U.S. PATENT DOCUMENTS

| | | | |
|---|---|---|---|
| 7,481,888 B2 * | 1/2009 | Nakada | H01L 21/324 |
| | | | 118/728 |
| 7,661,544 B2 | 2/2010 | Herzog | |
| 8,067,820 B2 * | 11/2011 | Kihara | H01L 21/67306 |
| | | | 211/41.18 |
| 8,220,647 B2 | 7/2012 | Gilmore et al. | |
| 8,287,649 B2 * | 10/2012 | Kobayashi | H01L 21/67309 |
| | | | 432/5 |
| 10,008,402 B1 | 6/2018 | Ogitsu | |
| 2003/0002973 A1 | 1/2003 | Kostler et al. | |
| 2004/0109748 A1 | 6/2004 | Raymond et al. | |
| 2005/0205502 A1 | 9/2005 | Brown et al. | |
| 2006/0226094 A1 * | 10/2006 | Cho | B65G 49/062 |
| | | | 211/41.18 |
| 2007/0006803 A1 * | 1/2007 | Cadwell | H01L 21/67309 |
| | | | 117/200 |
| 2007/0297876 A1 | 12/2007 | Sasajima et al. | |
| 2009/0321372 A1 | 12/2009 | Gilmore et al. | |
| 2011/0017948 A1 | 1/2011 | Fukuda | |
| 2013/0284683 A1 | 10/2013 | Jdira et al. | |
| 2020/0048789 A1 | 2/2020 | Soeta et al. | |

FOREIGN PATENT DOCUMENTS

| | | |
|---|---|---|
| CN | 101173369 A | 5/2008 |
| CN | 102912424 A | 2/2013 |
| CN | 203307477 U | 11/2013 |
| CN | 106567124 A | 4/2017 |
| JP | H06168902 A | 6/1994 |
| JP | H1092757 A | 4/1998 |
| JP | 2000100739 A | 4/2000 |
| WO | 2009119342 A1 | 10/2009 |

* cited by examiner

WAFER BOATS FOR SUPPORTING SEMICONDUCTOR WAFERS IN A FURNACE

CROSS-REFERENCE TO RELATED APPLICATIONS

This application is a continuation of U.S. Non-provisional Patent Application Ser. No. 17/355,538, filed Jun. 23, 2021, which claims the benefit of U.S. Provisional Patent Application No. 63/044,700, filed Jun. 26, 2020. Both applications are incorporated herein by reference in their entirety.

FIELD OF THE DISCLOSURE

The field of the disclosure relates to semiconductor wafer boats for supporting semiconductor wafers and, more particularly, semiconductor wafer boats for use in the heat-treatment of semiconductor wafers in a furnace.

BACKGROUND

Semiconductors wafers are commonly heat-treated at high temperatures (i.e., annealed) to achieve certain desirable characteristics. For example, annealing may be used to create a defect free layer of silicon on the wafer. The high temperature annealing process is typically carried out in a vertical furnace which subjects the wafers to temperatures above 1100° C. (e.g., between about 1200° C. and about 1300° C.).

A plurality of semiconductor wafers may be supported in the vertical furnace by a wafer boat or "rack". The wafer boat includes one or more supports on which the semiconductor wafer rests. During exposure to the high temperatures, particularly temperatures above 1100° C., the wafers become temporarily more plastic, i.e., the yield strength of the wafers decreases. Contact areas on the wafer where the wafer is supported may undergo slip due to local gravitational and thermal stresses. Slip may introduce contaminants into the wafer. In addition, excessive slip may lead to plastic deformation of the wafers, leading to production problems, such as photolithography overlay failures causing yield losses in device manufacture.

The supports aim to hold the semiconductor wafer while minimizing local gravitational and thermal stresses to prevent slip and plastic deformation while the wafers are being heat-treated. Conventionally, a wafer boat used in a vertical furnace includes three or more rods. The rods have laterally extending fingers lying generally in a common horizontal plane. This configuration is conventional and generally adequate for heating wafers with smaller diameters such as 200 mm or less. Larger diameter wafers (e.g., greater than 200 mm) are subjected to greater local gravitational and thermal stress than smaller diameters wafers. Such larger diameter wafers are conventionally loaded onto support rings which provide a greater surface area for supporting the wafers. The support rings increase the time for loading and unloading of the semiconductor wafers onto the wafer boat.

A need exists for wafer boats that include supporting structures that reduce local gravitational and thermal stress in order to limit the incident of slip while supporting semiconductor wafers as they are subjected to high temperatures during an annealing process and for wafer boats that are capable of relatively high throughput for loading and unloading wafers.

This section is intended to introduce the reader to various aspects of art that may be related to various aspects of the disclosure, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

SUMMARY

One aspect of the present disclosure is directed to a wafer boat for supporting a plurality of semiconductor wafers in a furnace. The wafer boat includes a vertical rod and a set of fingers that extend radially inward from the vertical rod along a finger axis. Each finger of the set includes an elongated segment that extends from the vertical rod. A contact protuberance is disposed on the elongated segment toward a distal end of the finger for contacting and supporting a semiconductor wafer. At least a portion of the contact protuberance is raised with respect to the elongated segment. The contact protuberance has a longitudinal contact protuberance axis. The longitudinal contact protuberance axis and the finger axis are angled relative to each other.

Various refinements exist of the features noted in relation to the above-mentioned aspects of the present disclosure. Further features may also be incorporated in the above-mentioned aspects of the present disclosure as well. These refinements and additional features may exist individually or in any combination. For instance, various features discussed below in relation to any of the illustrated embodiments of the present disclosure may be incorporated into any of the above-described aspects of the present disclosure, alone or in any combination.

BRIEF DESCRIPTION OF THE DRAWINGS

Corresponding reference characters indicate corresponding parts throughout the drawings.

DETAILED DESCRIPTION

Figure 1:
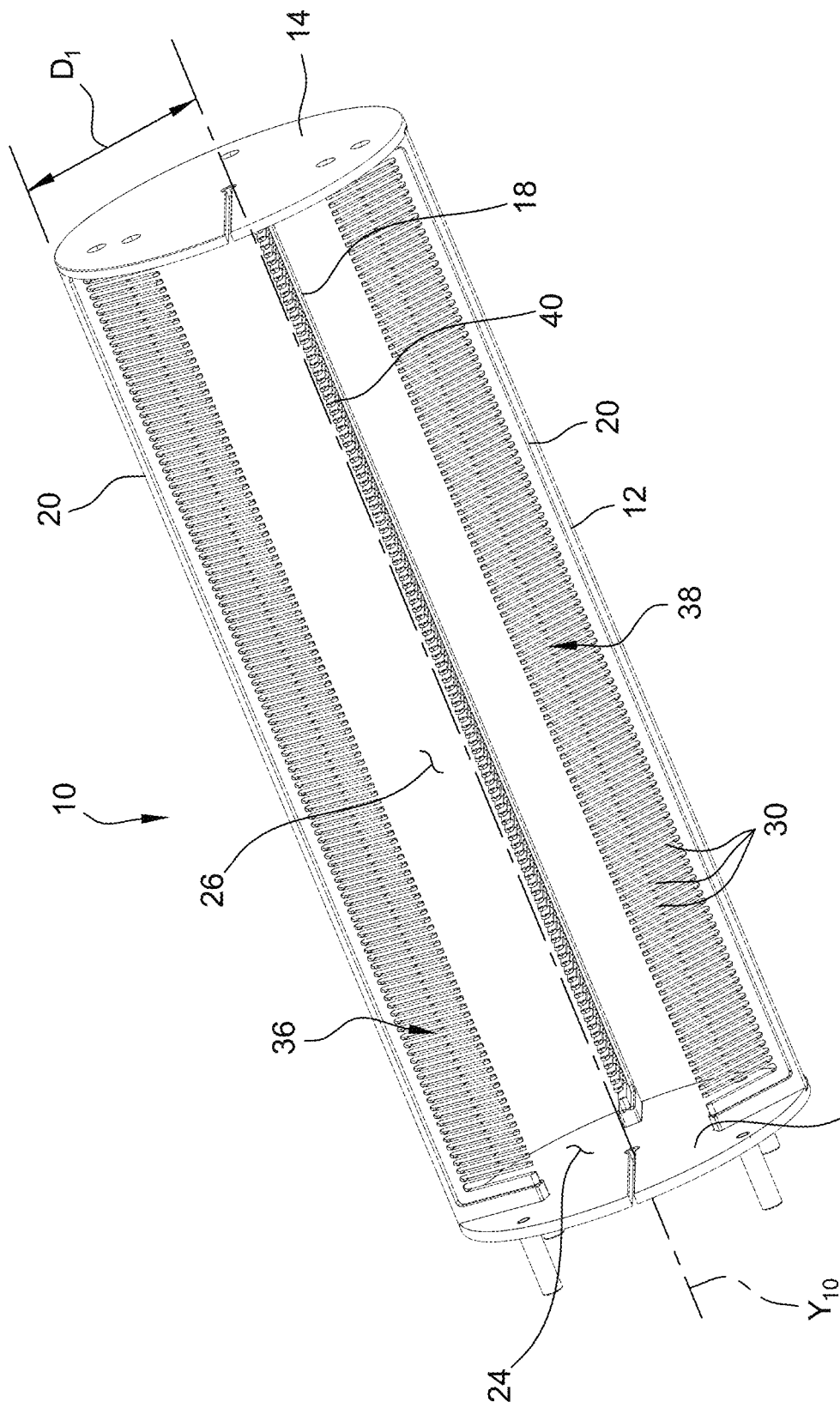
FIG. 1 is a perspective view of a wafer boat.

An example wafer boat for supporting a plurality of semiconductor wafers in a vertical furnace is indicated generally at "10" in FIG. 1. The wafer boat 10 supports the plurality of semiconductor wafers during a high temperature heat-treatment process (also referred to herein as an "anneal"). The wafer boat 10 includes at least one vertical rod 12 (and typically three or more rods) that is coupled to a top 14 and a base 16 of the wafer boat 10. The wafer boat 10 includes a longitudinal central axis $Y_{10}$ which extends from the top 14 to the base 16. The vertical rod 12 is arranged a distance $D_1$ from the longitudinal central axis $Y_{10}$ (FIG. 1).

Figure 2:
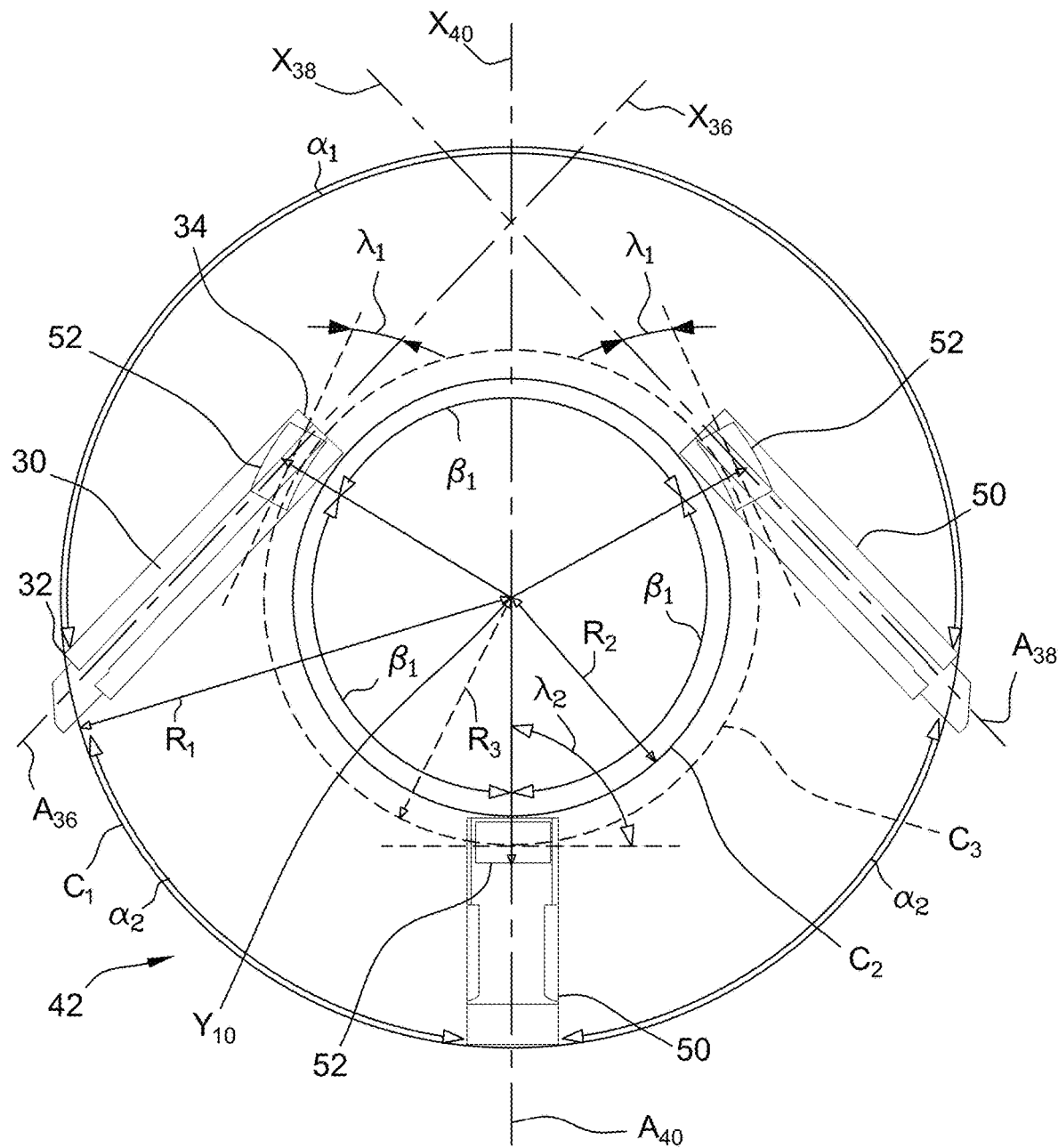
FIG. 2 is a top view of the wafer boat showing contact protuberances.
Figure 3:
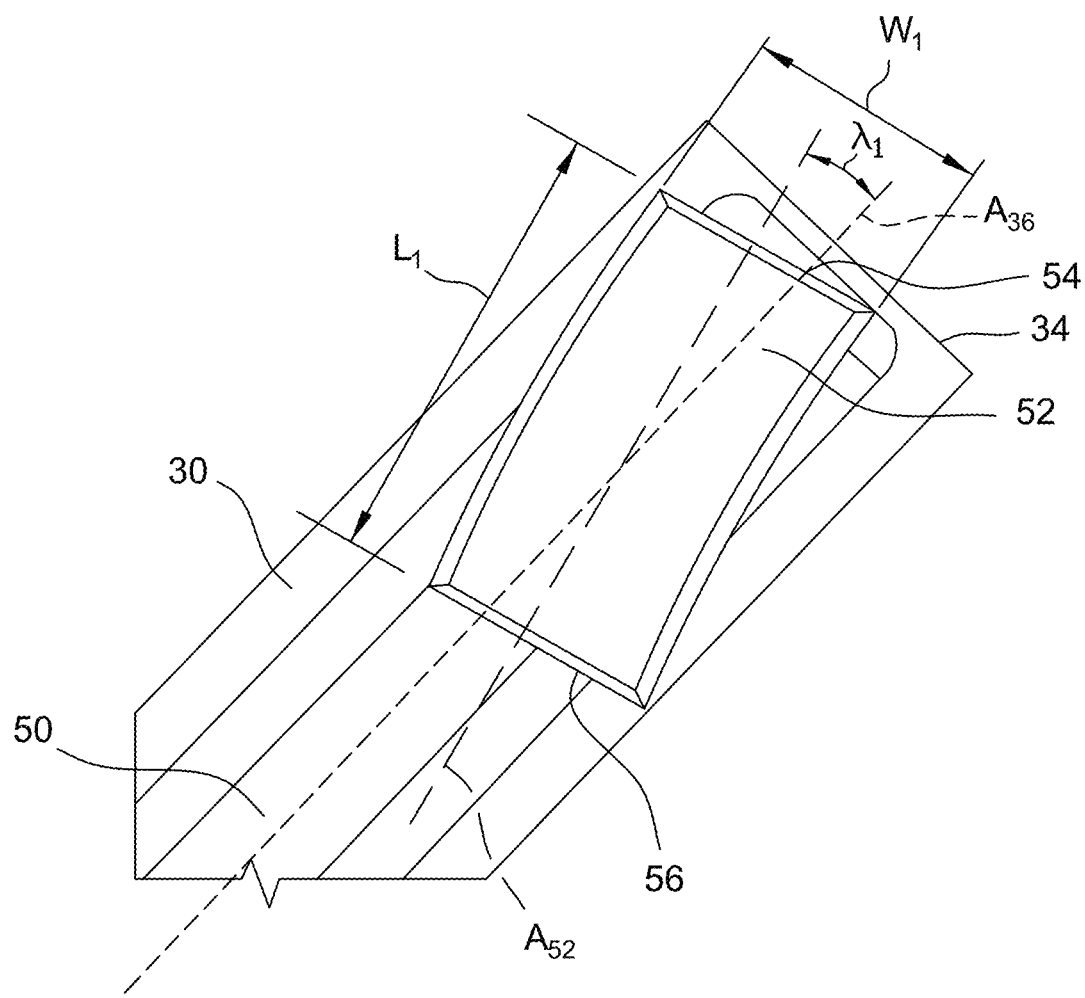
FIG. 3 is a detailed view of a contact protuberance of the wafer boat.

With reference to FIGS. 1-3, the illustrated wafer boat 10 includes three vertical rods 12 and, in particular, a central rod 18 and two forward rods 20. Each of the vertical rods 12 is arranged on a first circle $C_1$ (FIG. 2) centered about the longitudinal central axis $Y_{10}$ and having a radius $R_1$. The two forward rods 20 are spaced apart about the longitudinal central axis $Y_{10}$ by a first angle $\alpha_1$. The central rod 18 is spaced an equal circumferential distance between the two forward rods 20, such that the central rod 18 is spaced about the longitudinal central axis $Y_{10}$ at a second angle $\alpha_2$ relative to each of the two forward rods 20. The two forward rods 20 are spaced apart by the first angle $\alpha_1$ such that an entrance 24 (FIG. 1) is defined between the two forward rods 20. The first angle $\alpha_1$ may be any suitable angle such that the entrance 24 is sized to allow a semiconductor wafer to pass through the entrance 24 and arranged within an interior space 26 of the wafer boat 10. For example, the first angle $\alpha_1$ may be 180° or more and the second angle $\alpha_2$ may be 90° or less.

The wafer boat 10 includes fingers 30 that extend radially inward from the vertical rods 12 for supporting semiconductor wafers (i.e., the boat does not include support rings for supporting wafers). The two forward vertical rods 20 include a first and a second set 36, 38 of fingers 30, respectively. The central vertical rod 18 includes a third set 40 of the fingers 30. The first set 36 of fingers 30 extend along a first finger axis $A_{36}$, the second set 38 of fingers 30 extend along a second finger axis $A_{38}$, and the third set 40 of fingers extends along a third finger axis $A_{40}$. Each finger axis $A_{36}$, $A_{38}$, $A_{40}$ extends from a proximal end 32 of the finger 30 to a distal end 34 of the finger 30. The proximal end 32 of the finger 30 is proximate to the vertical rods 12 and the distal end 34 of the finger 30 is disposed in the interior space 26 of the wafer boat 10. The fingers 30 may be formed integrally with the vertical rods 12, e.g., cuts may be made in an elongate one-piece structure to form the fingers 30. Alternatively, the fingers 30 may be formed separately and coupled to the vertical rods 12.

The finger axes $A_{36}$, $A_{38}$ of the first and second sets 36, 38 of fingers 30, each extends over a chord $X_{36}$, $X_{38}$ of the first circle $C_1$. The chords $X_{36}$, $X_{38}$ do not intersect the longitudinal central axis $Y_{10}$ of the wafer boat 10 (i.e., the first and second sets 36, 38 of fingers are not centered such that they point to the longitudinal central axis $Y_{10}$). The finger axis $A_{40}$ of the third set 40 of fingers 30 extends over a chord $X_{40}$ of the first circle $C_1$ that intersects the longitudinal central axis $Y_{10}$.

A group 42 of fingers 30 that extend from each of the vertical rods 12 lies in the same, generally horizontal, plane to enable the group 42 of fingers 30 to support a semiconductor wafer. The distal ends 34 of the fingers 30 in the group 42 lie on a second circle $C_2$. The second circle $C_2$ has a radius $R_2$ and is centered on the longitudinal central axis $Y_{10}$. The radius $R_2$ extends from the distal ends 34 of the fingers 30 to the longitudinal central axis $Y_{10}$ of the wafer boat 10. In the illustrated embodiment, each of the distal ends 34 of the fingers 30 in the group 42 is arranged at an equal circumferential distance from each of the other distal ends 34 of the other fingers 30 in the group 42. For example, in the illustrated embodiment including the first, second, and third sets 36, 38, 40 of fingers 30, the distal ends 34 of each of the first, second, and third sets 36, 38, and 40 of fingers 30 are each spaced apart by an angle $\beta_1$ defined on the second circle $C_2$ centered on the longitudinal central axis $Y_{10}$. In the illustrated embodiment, the angle $\beta_1$ is 120°.

With reference to FIGS. 2 and 3, each of the fingers 30 includes an elongated segment 50 that extends from the vertical rod 12 and a contact protuberance 52 disposed on the elongated segment 50 towards the distal end 34 of the finger 30. The contact protuberance 52 contacts and supports a semiconductor wafer. The contact protuberance 52 is raised with respect to the elongated segment 50. The contact protuberance 52 has a first end 54, a second end 56, and a longitudinal contact protuberance axis $A_{52}$ that extends through the first and second ends 54, 56 of the contact protuberance 52. The contact protuberances 52 may be used to support any diameter of wafer including 200 mm diameter wafers, 300 mm diameter wafers and/or wafer that are greater than 300 mm in diameter.

For the first and second sets 36, 38 of fingers 30, the longitudinal contact protuberance axis $A_{52}$ and the respective finger axis $A_{36}$, $A_{38}$ are angled relative to each other at an angle $\lambda_1$, when viewed from above (FIG. 2). The angle $\lambda_1$ between the longitudinal contact protuberance axis $A_{52}$ and the respective finger axis $A_{36}$, $A_{38}$ is at least 5° or, as in other embodiments, at least 10°, at least 15°, at least 20°, from 5° to about 90°, or from 5° to about 75°. For the third set of fingers 30, the longitudinal contact protuberance axis $A_{52}$ and the finger axis $A_{40}$ are angled relative to each other at an angle $\lambda_2$, when viewed from above (FIG. 2). The angle $\lambda_2$ is 90° such that the longitudinal contact protuberance axis $A_{52}$ and the finger axis $A_{30}$ are perpendicular to each other. Each longitudinal contact protuberance axis $A_{52}$ is tangent to a third circle $C_3$ centered about the longitudinal central axis $Y_{10}$ of the wafer boat 10, at a location where the contact protuberance 52 intersects the third circle $C_3$. In this arrangement, the contact protuberance 52 are arranged in a rotationally symmetric pattern about the longitudinal central axis $Y_{10}$ (i.e., the contact protuberances are similarly spaced and angled about the central axis $Y_{10}$).

The illustrated contact protuberances 52 are rounded (e.g., each increases in height from its sides to an apex midway between the sides). The rounded contact protuberance 52 includes a surface that is generally cylindrical in shape. Each contact protuberance 52 includes a length $L_1$ (FIG. 3) extending along the longitudinal contact protuberance axis $A_{52}$ and a width $W_1$ perpendicular to the length $L_1$. The wafer rests on the rounded contact protuberance 52 generally along the longitudinal contact protuberance axis $A_{52}$.

In some embodiments, the contact protuberance 52 has a width $W_1$ of 10 mm to 25 mm and a length $L_1$ of 20 mm to 40 mm. Alternatively or in addition, the distance from the contact protuberance 52 to the longitudinal central axis $Y_{10}$ may be 75 mm to 125 mm. In some embodiments, the contact protuberance 52 has a width $W_1$ of 8 mm, a length $L_1$ of 30 mm, and the distance from the contact protuberance 52 to the longitudinal central axis $Y_{10}$ is 100 mm.

Figure 4:
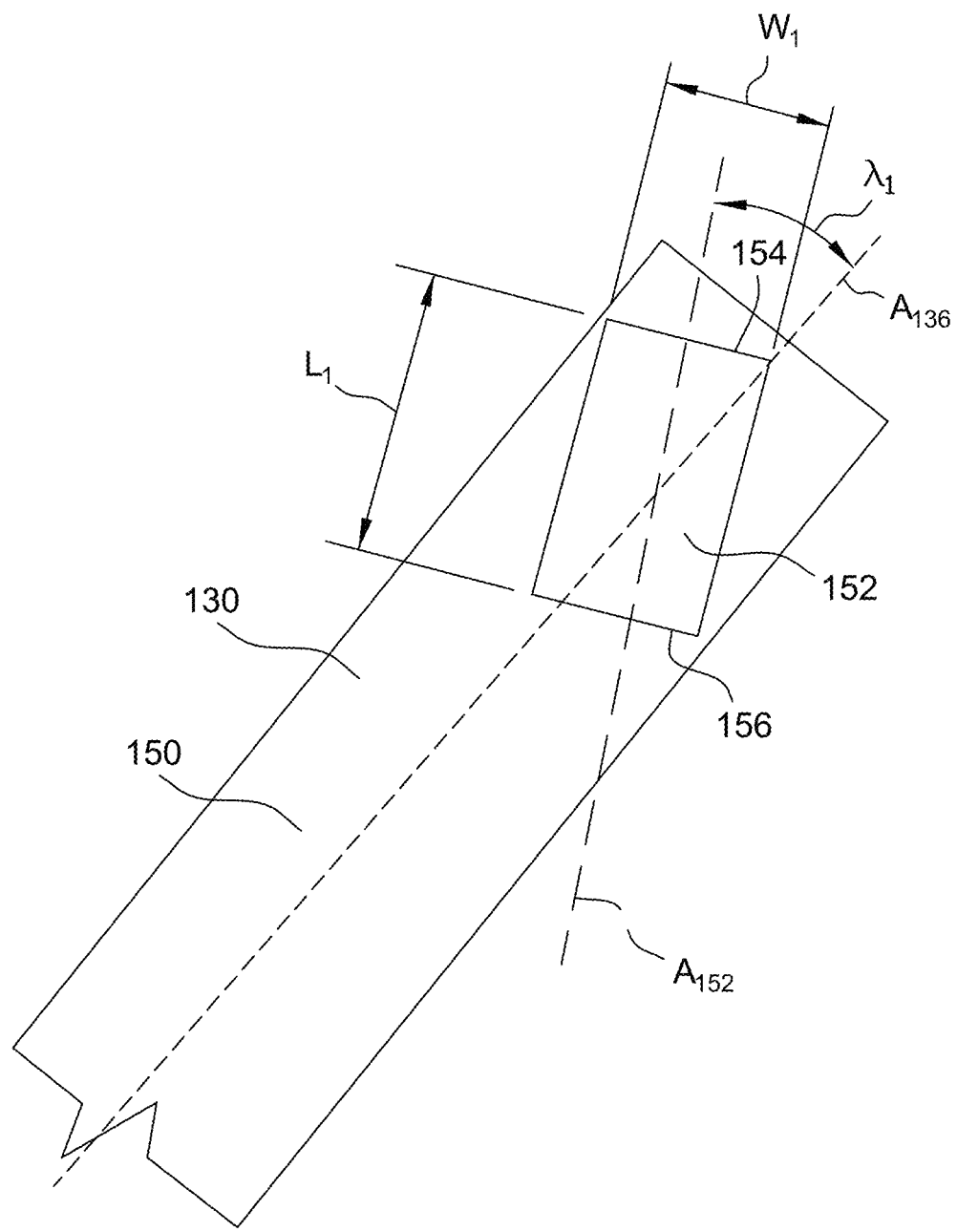
FIG. 4 is a detailed view of another embodiment of a contact protuberance.

In some embodiments such as the embodiment shown in Fig., 4, the contact protuberance 52 is flat. The components shown in FIG. 4 that are analogous to those of FIGS. 1-3 are designated by the corresponding reference number of FIGS. 1-3 plus "100" (e.g., part 52 becomes 152). The flat contact protuberance 152 includes a contact surface 153 defined by the longitudinal contact protuberance axis $A_{152}$ and includes a surface area that is defined by the length $L_1$ extending along the longitudinal contact protuberance axis $A_{152}$ and the width $W_1$, perpendicular to the length $L_1$. The surface 153, in its entirety, is generally in contact with the semiconductor wafer resting on the flat contact protuberance 152.

Alternatively, the protuberance 52 may be generally dome shaped with the semiconductor wafer resting on a relatively small, point-like, area.

Figure 5:
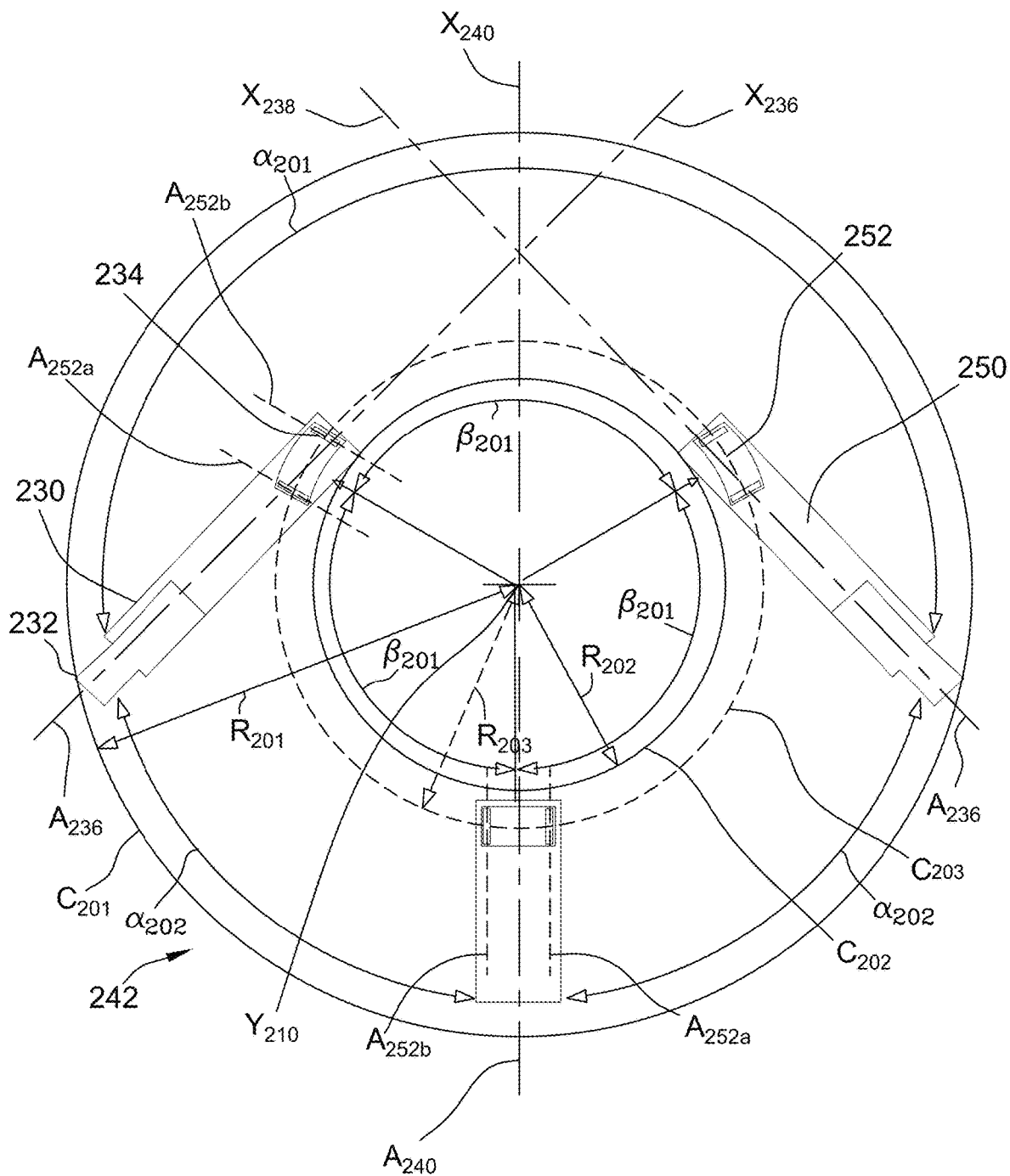
FIG. 5 is a top view of a wafer boat having another embodiment of contact protuberances.
Figure 6:
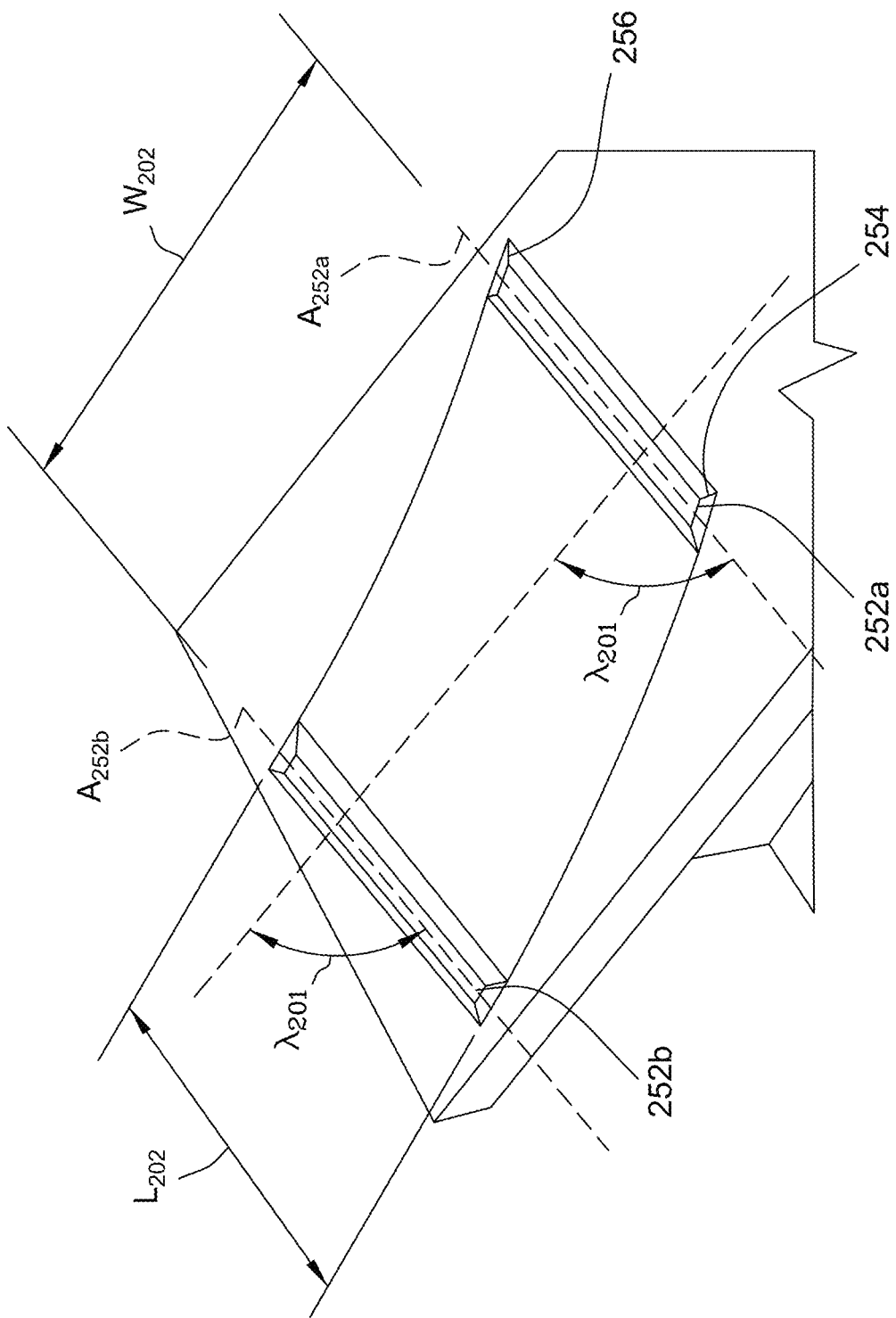
FIG. 6 is a detailed view of the contact protuberances shown in FIG. 5.

Another embodiment of the contact protuberance 52 is shown in FIGS. 5 and 6. The components shown in FIGS. 5-6 that are analogous to those of FIGS. 1-3 are designated by the corresponding reference number of FIGS. 1-3 plus "200" (e.g., part 52 becomes part 252). The finger 230 includes a first contact protuberance 252a that is raised with respect to the elongated segment 250. The first contact protuberance 252a has a first longitudinal contact protuberance axis $A_{252a}$. The finger 230 also includes a second contact protuberance 252b disposed toward a distal end 234 of the finger 230. At least a portion of the second contact protuberance 252b is raised with respect to the elongated segment 250. Each of the first and second contact protuberances 252a, 252b contacts and supports a semiconductor wafer. The second contact protuberance 252b includes a first end 254, a second end 256, and a second longitudinal contact protuberance axis $A_{252b}$ extending therebetween. In the illustrated embodiment, the first longitudinal contact protuberance axis $A_{252a}$ and the second longitudinal contact protuberance axis $A_{252b}$ are general parallel to each other.

For the first and second sets 236, 238 of fingers 230, the first and second protuberances axes $A_{252a}$, $A_{252b}$ are angled relative to the finger axis $A_{230}$ at an angle $\lambda_{201}$. For the third set 240 of fingers 230, the first and second protuberances axes $A_{252a}$, $A_{252b}$ are generally parallel to the finger axis $A_{230}$. The first and second contact protuberances 252a, 252b may be arranged at any angle $\lambda_{201}$ relative to the finger axis $A_{230}$ such that the contact protuberances 252a, 252b are arranged in a rotationally symmetric pattern about the longitudinal central axis $Y_{210}$.

The first and second contact protuberances 252a, 252b have an elongated shape having a length of $L_2$ which extends along the first and second protuberances axes $A_{252a}$, $A_{252b}$. The first and second contact protuberances 252a, 252b may be separated by a distance $W_2$. In some embodiments, $W_2$ is from 10 mm to 40 mm, 15 mm to 30 mm or, as in other embodiments, is 24 mm. The first and second contact protuberances 252a, 252b may have a variety of shapes such as a cylindrical cross-section, a rectangular cross-section (i.e., flat contact) or a trapezoidal cross-section (e.g., flattened top section).

Each group 242 of contact protuberances 252a, 252b that lies in a common horizontal plane is in contact with and supports a wafer. The wafer rests on top of each of the contact protuberances 252a, 252b such that the weight of the wafer is generally distributed evenly onto each of the contact protuberances 252. In the illustrated embodiment, each of the six contact protuberances 252a, 252b in the group 242 supports 1/6 of the weight of the wafer.

Figure 7:
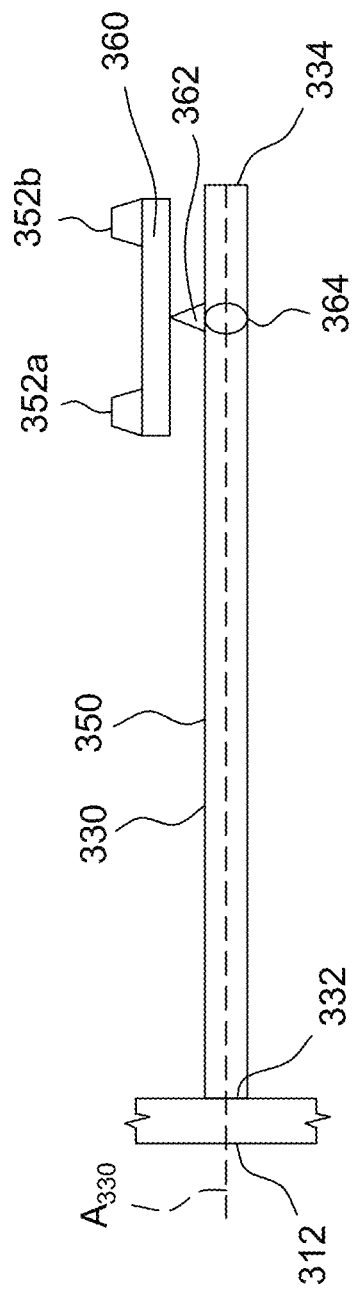
FIG. 7 is a detailed side view of a contact protuberance supported by a pin and gimbal.

Another embodiment of the contact protuberance 352 is shown in FIG. 7. The components shown in FIG. 7 that are analogous to those of FIGS. 1-3 are designated by the corresponding reference number of FIG. 1-3 plus "300" (e.g., part 10 becomes part 310). In reference to FIG. 7, each of the fingers 330 includes an elongated segment 350 that extends from a vertical rod 312. The fingers 330 include a platform 360 that supports a first and second contact protuberance 352a, 352b. The platform 360 is coupled to the elongated segment 350 by a pin 362 which is pivotally connected to the elongated segment 350 by a cylindrical joint or a gimbal 364. Accordingly, the pin 362 and gimbal 364 allow the platform 360 to pivot relative to the elongated segment 350. The platform 360 supports the first and the second contact protuberances 352a, 352b each of which contacts and supports a semiconductor wafer.

The pivoting of the platform 360 enabled by the pin 362 and gimbal 364, counter acts uneven load distribution caused by machining inaccuracies and allows the platform 360 to pivot in response to the uneven loading on the contact protuberances 352a, 352b. The platform 360 may pivot to more evenly distribute the wafer weight on each of the contact protuberance 352a, 352b. After the wafer boat 310 is placed in the vertical furnace and exposed to oxidization, the pin 362 and the gimbal 364 will become fixed, preventing further pivoting of the platform 360, for the duration of the annealing process.

The wafer boats of the present disclosure have several advantages compared to conventional wafer boats. In embodiments wherein the wafer boat includes one or more contact protuberances arranged in a rotationally symmetric pattern, the local gravitational and thermal stress in semiconductor wafers loaded onto the wafer boat are reduced during annealing which reduced slip. In embodiments wherein the wafer boat includes a pin and gimbal which supports a platform having two or more contact protuberances, the platform may pivot to adjust for uneven loading of the contact protuberances caused by machining inaccuracies.

EXAMPLES

The processes of the present disclosure are further illustrated by the following Examples. These Examples should not be viewed in a limiting sense.

Example 1: Peak Stress in Wafer for Different Boat Designs

Peak stress in wafers was measured for different boat designs having different finger arrangements using a finite element model. One wafer boat included fingers having flat contact protuberances with the contact protuberances of the fingers extending from the forward rods not being angled with respect to the finger axis (i.e., the contact protuberance axis and finger axis were parallel causing the contact protuberances to not be rotationally symmetric). A second wafer boat was similar to the first but the contact protuberances were cylindrical. A third wafer boat included cylindrical contacts arranged as shown in FIG. 2 (i.e., the fingers extending from the two forward rods having contact protuberances angled with respect to the finger axis and the fingers extending from the central rod being perpendicular to the central axis such that the contact protuberances were rotationally symmetric). A fourth boat included two contact protuberances on each finger that were rotationally symmetric as shown in FIGS. 5-6. The peak stresses for each boat are shown in Table 1 below:

TABLE 1

Peak Stress in Wafer, for Different Boat Designs having Different Arrangements of Contact Protuberances

| Wafer Boat | Peak Stress in Wafer (MPa) |
|---|---|
| Boat 1 (Flat-Not Rotationally Symmetric) | 1.33 |
| Boat 2 (Cylindrical-Not Rotationally Symmetric) | 1.34 |
| Boat 3 (Cylindrical-Rotationally Symmetric) | 1.18 |
| Boat 4 (Two Small Contact Protuberances-Rotationally Symmetric) | 1.19 |

As shown in Table 1, the wafer boats in which the contact protuberances were rotationally symmetric (Boats 3 and 4) had reduced peak stresses which reduced slip in semiconductor wafers annealed in the wafer boats.

As used herein, the terms "about," "substantially," "essentially" and "approximately" when used in conjunction with ranges of dimensions, concentrations, temperatures or other physical or chemical properties or characteristics is meant to cover variations that may exist in the upper and/or lower limits of the ranges of the properties or characteristics, including, for example, variations resulting from rounding, measurement methodology or other statistical variation.

When introducing elements of the present disclosure or the embodiment (s) thereof, the articles "a," "an," "the," and "said" are intended to mean that there are one or more of the elements. The terms "comprising," "including," "containing," and "having" are intended to be inclusive and mean that there may be additional elements other than the listed elements. The use of terms indicating a particular orientation (e.g., "top," "bottom," "side," etc.) is for convenience of description and does not require any particular orientation of the item described.

As various changes could be made in the above constructions and methods without departing from the scope of the disclosure, it is intended that all matter contained in the above description and shown in the accompanying drawing [s] shall be interpreted as illustrative and not in a limiting sense.

What is claimed is:

1. A wafer boat for supporting a plurality of semiconductor wafers in a furnace comprising:
    a vertical rod;
    a set of fingers that extend radially inward from the vertical rod along a finger axis, each finger of the set comprising:
        an elongated segment that extends from the vertical rod, the elongated segment having a portion having a constant width; and
        a contact protuberance disposed on the elongated segment toward a distal end of the finger for contacting and supporting a semiconductor wafer, at least a portion of the contact protuberance being raised with respect to the elongated segment, the contact protuberance having a longitudinal contact protuberance axis, the longitudinal contact protuberance axis and the finger axis being angled relative to each other at an angle from 5° to about 75°, the contact protuberance including a rounded surface for supporting and contacting a semiconductor wafer, the contact protuberance being disposed on the portion of the elongated segment having a constant width.

2. The wafer boat as set forth in claim 1 wherein the contact protuberance has a width of 10 mm to 25 mm, a length of 20 mm to 40 mm, and the distance from the contact protuberance to a longitudinal central axis of the wafer boat is from 75 mm to 125 mm.

3. The wafer boat as set forth in claim 1 wherein the contact protuberance has a width of 16 mm, a length of 30 mm, and the distance from the contact protuberance to a longitudinal central axis of the wafer boat is 100 mm.

4. The wafer boat as set forth in claim 1 wherein the angle between the longitudinal contact protuberance axis and the finger axis is at least 5°.

5. The wafer boat as set forth in claim 1 wherein the angle between the longitudinal contact protuberance axis and the finger axis is at least 20°.

6. The wafer boat as set forth in claim 1 wherein the longitudinal contact protuberance axis is tangent to a circle centered about a longitudinal central axis of the wafer boat, at a location where the contact protuberance intersects the circle.

7. The wafer boat as set forth in claim 1 wherein the contact protuberance is a first contact protuberance and the longitudinal contact protuberance axis is a longitudinal first contact protuberance axis, the finger comprising a second contact protuberance toward a distal end of the finger for contacting and supporting the semiconductor wafer, at least a portion of the second contact protuberance being raised with respect to the elongated segment, the second contact protuberance having a longitudinal second contact protuberance axis, the longitudinal second contact protuberance axis and the finger axis being angled relative to each other.

8. The wafer boat as set forth in claim 7 wherein the longitudinal second contact protuberance axis is parallel to the longitudinal first contact protuberance axis.

9. The wafer boat as set forth in claim 7 wherein the first and second contact protuberances are supported by a platform, the platform is mounted to a pin pivotable about a gimbal mounted to the distal end of the elongated segment.

10. The wafer boat as set forth in claim 1 wherein the finger axis extends over a chord of a circle centered about a longitudinal central axis of the wafer boat, the chord not intersecting the longitudinal central axis of the wafer boat.

11. The wafer boat as set forth in claim 10 wherein the vertical rod is a first rod, the set of fingers is a first set of fingers, and the chord is a first chord, the wafer boat comprising:
    a second vertical rod;
    a second set of fingers that extend radially inward from the second vertical rod along a second finger axis, the second finger axis extending over a second chord of the circle, the second chord not intersecting the longitudinal central axis of the wafer boat, each finger of the second set comprising:
        an elongated segment that extends from the second vertical rod; and
        a contact protuberance disposed on the elongated segment toward a distal end of the finger for contacting and supporting a semiconductor wafer, at least a portion of the contact protuberance being raised with respect to the elongated segment, the contact protuberance having a longitudinal contact protuberance axis, the longitudinal protuberance axis and the second finger axis being angled relative to each other.

12. The wafer boat as set forth in claim 11 further comprising:
    a third vertical rod;
    a third set of fingers that extend radially inward from the third vertical rod along a third finger axis, the third finger axis extending over a third chord of the circle, the third chord intersecting the longitudinal central axis of the wafer boat, each finger of the third set comprising:
    an elongated segment that extends from the third vertical rod; and
    a contact protuberance disposed on the elongated segment toward a distal end of the finger for contacting and supporting a semiconductor wafer, at least a portion of the contact protuberance being raised with respect to the elongated segment, the contact protuberance having a longitudinal contact protuberance axis, the protuberance axis and the third finger axis being perpendicular.

13. The wafer boat as set forth in claim 12 wherein the distal end of each finger is spaced about 120° about the wafer boat.

14. The wafer boat as set forth in claim 12 wherein the contact protuberances of the first set, second set, and third set are spaced 120° about the wafer boat.

15. The wafer boat as set forth in claim 12 wherein the contact protuberances of the first set, second set, and the third set are arranged such that contact protuberances of the first set, second set, and the third set are in a rotationally symmetric pattern.

16. A wafer boat for supporting a plurality of semiconductor wafers in a furnace comprising:
- a vertical rod;
- a set of fingers that extend radially inward from the vertical rod along a finger axis, each finger of the set comprising:
  - an elongated segment that extends from the vertical rod, the elongated segment having a portion having a constant width; and
  - a contact protuberance disposed on the elongated segment toward a distal end of the finger for contacting and supporting a semiconductor wafer, at least a portion of the contact protuberance being raised with respect to the elongated segment, the contact protuberance having a longitudinal contact protuberance axis, the longitudinal contact protuberance axis and the finger axis being angled relative to each other at an angle from 5° to about 75°, wherein the longitudinal contact protuberance axis is tangent to a circle centered about a longitudinal central axis of the wafer boat, at a location where the contact protuberance intersects the circle, the contact protuberance being disposed on the portion of the elongated segment having a constant width.

17. The wafer boat as set forth in claim 16 wherein the contact protuberance includes a rounded surface for supporting and contacting a semiconductor wafer.

18. The wafer boat as set forth in claim 16 wherein the contact protuberance includes a flat surface for supporting and contacting a semiconductor wafer.

19. The wafer boat as set forth in claim 16 wherein the vertical rod is a first vertical rod, the set of fingers is a first set of fingers, and the finger axis being a first finger axis, wherein the first finger axis extends over a chord of a circle centered about a longitudinal central axis of the wafer boat, the chord not intersecting the longitudinal central axis of the wafer boat, the wafer boat further comprising:
- a second vertical rod;
- a second set of fingers that extend radially inward from the second vertical rod along a second finger axis, the second finger axis extending over a chord of the circle, the chord not intersecting the longitudinal central axis of the wafer boat, each finger of the second set comprising:
  - an elongated segment that extends from the second vertical rod; and
  - a contact protuberance disposed on the elongated segment toward a distal end of the finger for contacting and supporting a semiconductor wafer, at least a portion of the contact protuberance being raised with respect to the elongated segment;
- a third vertical rod;
- a third set of fingers that extend radially inward from the third vertical rod along a third finger axis, the third finger axis extending over a chord of the circle, the chord intersecting the longitudinal central axis of the wafer boat, each finger of the third set comprising:
  - an elongated segment that extends from the third vertical rod; and
  - a contact protuberance disposed on the elongated segment toward a distal end of the finger for contacting and supporting a semiconductor wafer, at least a portion of the contact protuberance being raised with respect to the elongated segment, wherein the contact protuberances or the first, second, and third set of fingers are spaced 120° about the wafer boat.

* * * * *